US008470690B2

(12) United States Patent
Roca I Cabarrocas et al.

(10) Patent No.: US 8,470,690 B2
(45) Date of Patent: Jun. 25, 2013

(54) METHOD FOR PRODUCING A MULTILAYER FILM INCLUDING AT LEAST ONE ULTRATHIN LAYER OF CRYSTALLINE SILICON, AND DEVICES OBTAINED BY MEANS OF SAID METHOD

(75) Inventors: Pere Roca I Cabarrocas, Villebon sur Yvette (FR); Mario Moreno, Palaiseau (FR)

(73) Assignees: Centre National de la Recherche Scientifique, Paris (FR); Ecole Polytechnique, Palaiseau (FR)

( * ) Notice: Subject to any disclaimer, the term of this patent is extended or adjusted under 35 U.S.C. 154(b) by 0 days.

(21) Appl. No.: 13/502,569

(22) PCT Filed: Oct. 15, 2010

(86) PCT No.: PCT/FR2010/052198
§ 371 (c)(1),
(2), (4) Date: Apr. 18, 2012

(87) PCT Pub. No.: WO2011/048308
PCT Pub. Date: Apr. 28, 2011

(65) Prior Publication Data
US 2012/0208358 A1    Aug. 16, 2012

(30) Foreign Application Priority Data
Oct. 19, 2009    (FR) ..................... 09 57301

(51) Int. Cl.
*H01L 21/30*    (2006.01)
(52) U.S. Cl.
USPC ..................... 438/458; 257/E21.57
(58) Field of Classification Search
USPC ........... 438/455, 458, 489, 795; 257/E21.57, 257/E21.571, E21.572
See application file for complete search history.

(56) References Cited

U.S. PATENT DOCUMENTS

| | | | |
|---|---|---|---|
| 6,712,288 B2 * | 3/2004 | Yanagita et al. | ............. 239/101 |
| 2008/0188062 A1 | 8/2008 | Chen et al. | |
| 2008/0245414 A1 | 10/2008 | Sheng et al. | |

FOREIGN PATENT DOCUMENTS

EP    1 445 802    8/2004

OTHER PUBLICATIONS

International Search Report dated Jan. 25, 2011, corresponding to PCT/FR2010/052198.
Roca I Cabarrocas; "New approaches for the production of nano-, micro-, and polycrystalline silicon thin films"; vol. 1, No. 5, Jan. 1, 2004; pp. 1115-1130.
Bergmann, et al.; "The future of crystalline silicon films on foreign substrates"; vol. 403-404, Jan. 1, 2002; pp. 162-169.
Roca I Cabarrocas et al.; "Microcrystalline Silicon: An emerging Material for Stable Thin-Film Transistors"; vol. 12, No. 1; Mar. 1, 2004; pp. 3-09.
Young-Bae Park, et al.; "Effect of hydrogen plasma precleaning on the removal of interfacial amorphous layer in the chemical vapor deposition of mircrocrystalline silicon films on silicon oxide surface"; vol. 68, No. 16; Apr. 15, 1996; pp. 2219-2221.

* cited by examiner

*Primary Examiner* — Quoc Hoang
(74) *Attorney, Agent, or Firm* — Young & Thompson

(57) ABSTRACT

Method of fabricating a multilayer film having at least one ultrathin layer of crystalline silicon, the film being fabricated from a substrate having a crystalline structure and including a previously-cleaned surface. The method includes the steps of: a) exposing the cleaned surface to a radiofrequency plasma generated in a gaseous mixture of SiF4, hydrogen, and argon, so as to form an ultrathin layer of crystalline silicon having an interface sublayer in contact with the substrate and containing microcavities; b) depositing at least one layer of material on the ultrathin layer of crystalline silicon so as form a multilayer film, the multilayer film including at least one mechanically strong layer; and c) annealing the substrate covered in the multilayer film at a temperature higher than 400° C., thereby enabling the multilayer film to be separated from the substrate.

13 Claims, 4 Drawing Sheets

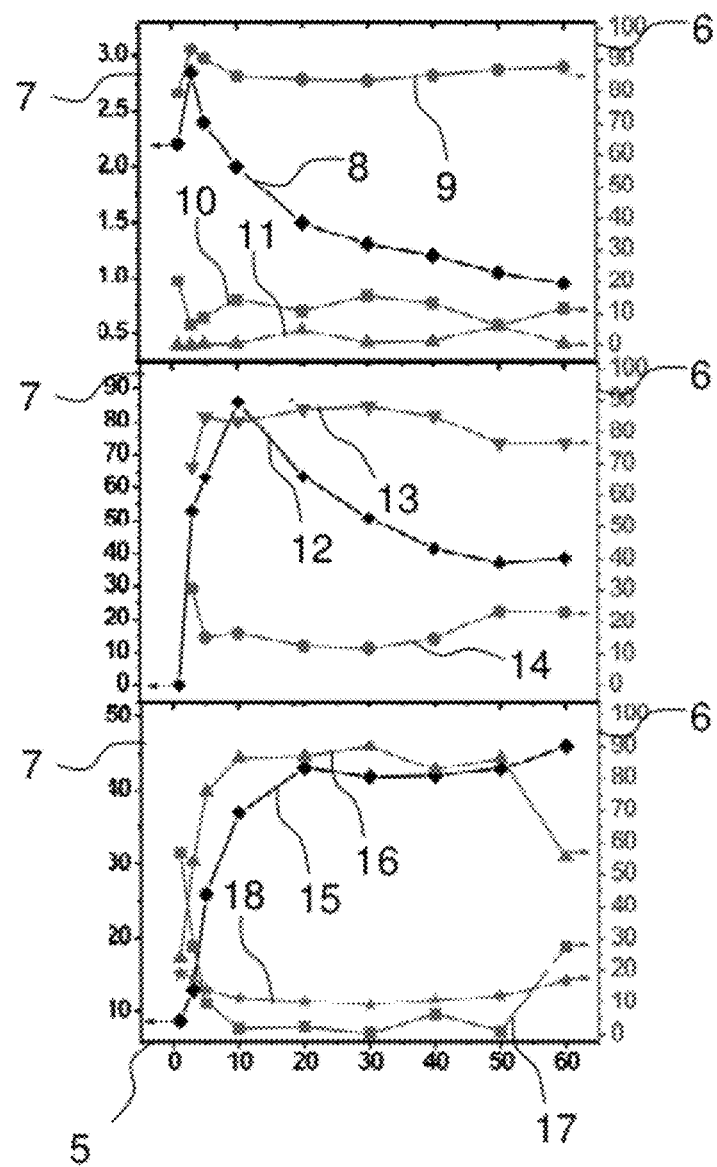
FIGURE 4a
FIGURE 4b
FIGURE 4c
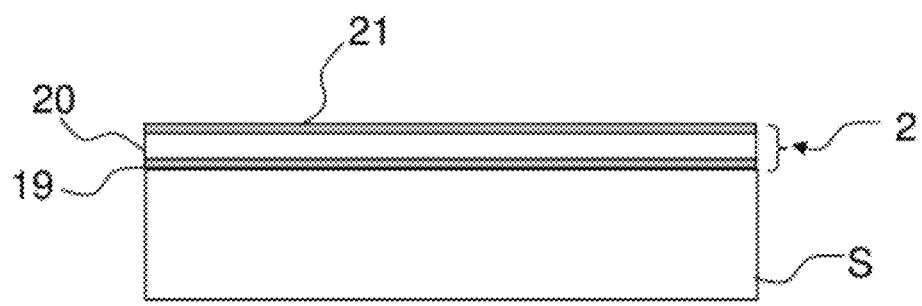
FIGURE 5

METHOD FOR PRODUCING A MULTILAYER FILM INCLUDING AT LEAST ONE ULTRATHIN LAYER OF CRYSTALLINE SILICON, AND DEVICES OBTAINED BY MEANS OF SAID METHOD

The invention relates to a method of fabricating a multilayer film comprising one or more ultrathin layers of crystalline silicon, the film being fabricated from a substrate having a crystalline structure.

The multilayer film, based on crystalline silicon (c-Si), is for depositing on a flexible or rigid support in order to fabricate solar cells or microelectronic devices.

The term "ultrathin layer" is used to mean a layer of thickness lying in the range 0.1 micrometers (µm) to 5 µm.

Solar cells of high efficiency and microelectronic devices are fabricated using crystalline silicon.

The problem with solar cells and microelectronic devices based on crystalline silicon is their high cost of fabrication due to the large quantities of silicon used in fabricating them.

Methods exist that seek to reduce the quantities of crystalline silicon needed for fabricating solar cells and microelectronic devices.

More particularly, such methods enable heterojunction solar cells to be obtained that are fabricated on crystalline silicon substrates that are thin (50 µm to 100 µm) and that provide very high efficiencies (17% to 22%).

Other methods also exist such as the method of cutting by implanting $H^+$ ions (the "smart cut" method), and the method of cutting by using ions that makes it possible to obtain films of crystalline silicon having small thicknesses.

The smart cut method, as shown in FIG. 1, is known from the document by M. Bruel, "Separation of silicon wafers by the smart cut method", Mat. Res. Innovat. (1999), 3, 9-13.

Those techniques implant $H^-$ ions in crystalline silicon substrates at doses lying in the range $10^{16}$ $H^+$ ions per square centimeter ($H^+/cm^2$) to $10^{17}$ $H^+/cm^2$ in order to create defects (microcavities) at a certain distance from the surface of the silicon substrate.

A substrate is obtained that has a layer of crystalline silicon that is very thin (0.3 µm to 1 µm) and that has a large quantity of defects.

Thereafter, a hydrophilic bond is established with a second crystalline silicon substrate. The second crystalline silicon substrate is put into contact with the defect-containing surface of the first substrate. Heat treatment is performed at a temperature higher than 1000° C.

During the first stage of the heat treatment, the very thin film of crystalline silicon separates from the first substrate and bonds to the second substrate. During a second stage, the chemical bonds between the very thin film of crystalline silicon and the second substrate are consolidated.

The drawback of those methods is that they involve steps of implanting $H^+$ ions and of performing heat treatment at high temperature (>1000° C.), which steps are complicated to implement and expensive. High temperature annealing also limits the methods to substrates made of crystalline silicon or refractory materials.

Furthermore, with those prior art methods, it is not possible to obtain crystalline silicon films having a thickness of less than 0.3 µm or greater than 1 µm, nor it is possible to make junctions or devices directly.

Thus, an object of the invention is to propose a method of fabricating a multilayer film comprising at least one ultrathin layer of crystalline silicon, which method is simpler, less burdensome, and enables crystalline silicon films to be obtained that present thickness lying in the range 0.1 µm to 5 µm.

To this end, the invention provides a method of fabricating a multilayer film comprising at least one ultrathin layer of crystalline silicon, the film being fabricated from a substrate having a crystalline structure and including a previously-cleaned surface.

According to the invention, the method comprises the following steps:

a) exposing said cleaned surface to a radiofrequency plasma generated in a gaseous mixture of $SiF_4$, hydrogen, and argon, the power density of the radiofrequency plasma lying in the range 100 milliwatts per square centimeter ($mW/cm^2$) to 650 $mW/cm^2$, the pressure of the gaseous mixture in the range 200 pascals (Pa) to 400 Pa, the temperature of the substrate lying in the range 150° C. to 300° C., the flow rate of $SiF_4$ lying in the range 1 cubic centimeter per minute ($cm^3$/min) to 10 $cm^3$/min, the flow rate of hydrogen lying in the range 1 $cm^3$/min to 60 $cm^3$/min, the flow rate of argon lying in the range 1 $cm^3$/min to 80 $cm^3$/min, so as to form on said cleaned surface an ultrathin layer of crystalline silicon comprising a plurality of sublayers including an interface sublayer in contact with the substrate and containing microcavities;

b) depositing at least one layer of material on said ultrathin layer of crystalline silicon so as to co-operate with said ultrathin layer of crystalline silicon to form a multilayer film, said multilayer film including at least one mechanically strong layer so as to form a multilayer film having sufficient strength to enable said multilayer film to be separated without damaging the ultrathin layer of crystalline silicon; and c) annealing the substrate covered in said multilayer film at a temperature higher than 400° C., thereby enabling said multilayer film to be separated from the substrate.

A self-supporting multilayer film is thus obtained. The multilayer film may then be transferred onto a mechanical support that is flexible or rigid, and not crystalline, and the crystalline substrate may be reused.

In various possible implementations, the present invention also relates to the following characteristics, which may be considered in isolation or in any technically feasible combination, each of which provides its own specific advantages:

the duration of step a) lies in the range 1 minute (min) to 5 hours (h);

during step a), the power density of the radiofrequency plasma is 500 $mW/cm^2$, the pressure of the gaseous mixture is 293 Pa, and the temperature of the substrate covered in said multilayer film is 200° C.;

during step a), the gaseous flow rate of $SiF_4$ is 3 $cm^3$/min, the gaseous flow rate of hydrogen is 5 $cm^3$/min, and the gaseous flow rate of argon is 80 $cm^3$/min;

the mechanically strong layer is a layer of chromium deposited on one of the layers of the mechanically strong multilayer film by a vacuum evaporation method;

during step c) the substrate covered in said mechanically strong multilayer film is heated up to 800° C.;

in step b), said layer of chromium is covered in a layer of polyamide, and in step c), the substrate covered in the multilayer film is heated up to a temperature lying in the range 300° C. to 500° C.;

the surface of the substrate is initially covered in a layer of silicon oxide and the fabrication method includes, prior to step a), a step a') of cleaning the surface of the substrate that is initially covered in silicon oxide;

said step a') comprises an operation of exposing said surface to a radiofrequency plasma generated from a fluorine-containing gas, thereby etching the layer of silicon oxide, and an operation of exposing said surface to a radiofrequency plasma of hydrogen;

the steps a') and a) are performed in the same reaction chamber of a plasma-enhanced chemical vapor deposition (PECVD) reactor;

step a') comprises a standard cleaning operation using a wet method based on deionized water and HF;

step b) includes an operation of depositing a passivation layer (nitride or silicon oxide) prior to depositing the mechanically strong layer;

in step b), the deposited material is crystalline silicon or germanium, which may be intrinsic or doped; and during step b), a first layer of P- or N-doped material is deposited on said ultrathin crystalline silicon layer, said first layer of P- or N-doped material being covered in a second layer of N- or P-doped material in order to obtain a P-N or an N-P junction.

Thus, the invention provides a multilayer film fabrication method that is more simple, less onerous, and more flexible, and that enables films of crystalline silicon to be obtained having thickness lying in the range 0.1 µm to 5 µm, while presenting a high degree of crystallinity.

It is no longer necessary to use a method of cutting by implanting $H^+$ ions, which method is complicated to implement and expensive. The method of the invention is an alternative to that method of cutting.

The method of the invention is implemented in part in a PECVD reactor, unlike methods of the prior art (e.g. the "smart cut" method), thereby enabling the ultrathin layer of crystalline silicon to be deposited at low temperature. The substrate is not consumed.

Furthermore, unlike prior art methods, the invention makes it possible to use lower annealing temperatures (in the range approximately 400° C. to 600° C.) as compared with approximately 1000° C. in prior art methods.

The invention also makes it possible to make stacks of doped and non-doped layers so as to form P-N or N-P junctions. In prior art methods, doping is determined by the substrate, which is limiting.

In the invention, it is also possible to incorporate other elements such as germanium, and thus to make Si/Ge multilayer films, for example. In the prior art ("smart cut") methods, it is not possible to deposit materials other than the material of the substrate.

The invention is described in greater detail with reference to the accompanying drawings, in which:

FIG. 4a is a graph plotting the deposition rate of the fine epitaxial core sublayer of the ultrathin layer of silicon and the composition thereof as a function of the flow rate of hydrogen;

FIG. 4b is a graph plotting the thickness of the interface sublayer and the composition thereof as a function of the hydrogen flow rate;

FIG. 4c is a graph plotting the roughness of the surface sublayer and the composition thereof as a function of the hydrogen flow rate; and FIG. 5 is a detail view of the ultrathin layer of crystalline silicon.

The method comprises a first step 1) of implanting $H^+$ ions in a first silicon substrate S1 that is covered in a thin layer of silicon oxide, at a dose rate lying in the range $10^{16}$ $H^+/cm^2$ to $10^{17}$ $H^+/cm^2$, in order to create defects (microcavities) at a certain distance from the surface of the silicon substrate.

A substrate is obtained that includes a crystalline silicon layer 1 that is very thin (thickness lying in the range 0.3 µm to 1 µm) and that is full of defects.

Thereafter, a second step 2) is provided that consists in cleaning the first crystalline silicon substrate S1 and a second crystalline silicon substrate S2, and in establishing hydrophilic bonds with said second crystalline silicon substrate S2 at ambient temperature. The second crystalline silicon substrate S2 is put into contact with the surface of the first substrate S1 that has the defects.

A third step 3) of heat treatment is performed at a temperature higher than 1000° C. During an initial stage of heat treatment (400° C. to 600° C.), the very thin crystalline silicon film 1 separates from the first substrate S1 while remaining bonded to the second substrate S2. During a second stage of heat treatment (T>1000° C.), the chemical bonds between the very thin crystalline silicon film 1 and the second substrate S2 are consolidated.

A fourth step 4) consists in polishing the surface of the very thin crystalline silicon film 1 on the second substrate S2.

The drawback of that method is that it involves steps of implanting $H^+$ ions, and of performing heat treatment at high temperature (higher than 1000° C.), which steps are very complicated to implement and expensive.

Furthermore, with that prior art method, it is not possible to obtain crystalline silicon film at thicknesses of less than 0.3 µm, nor more than 1 µm.

Figure 1:
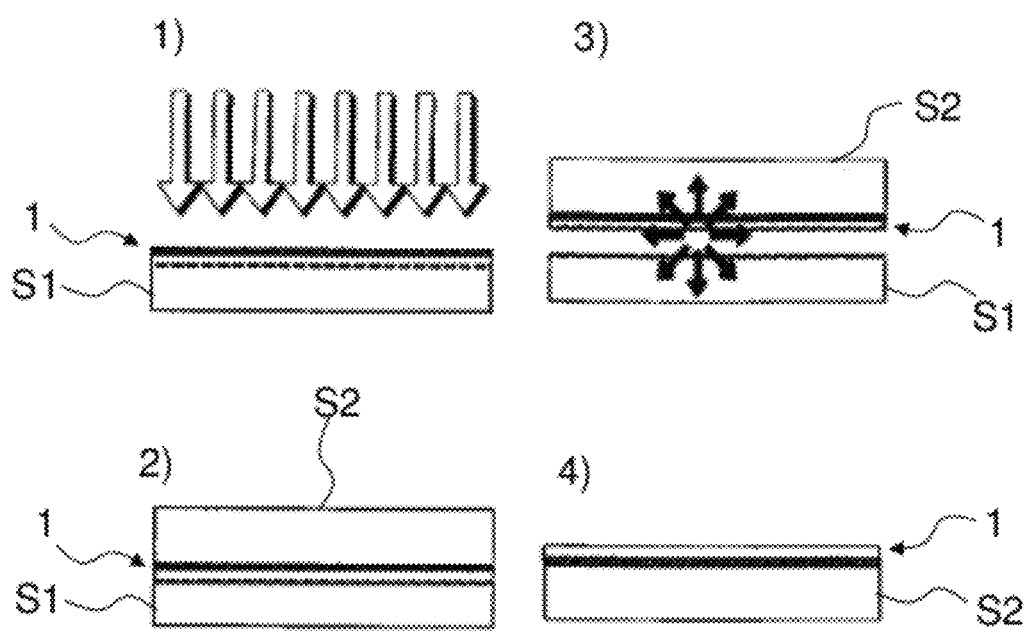
FIG. 1 shows a prior art method of cutting by implanting ions.
Figure 2:
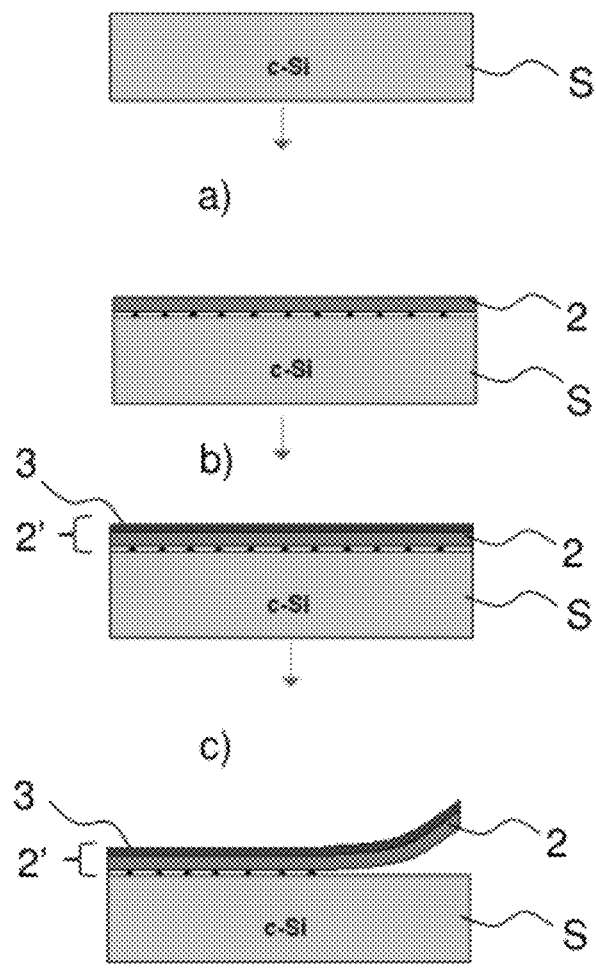
FIG. 2 shows a method of fabricating a multilayer film including an ultrathin layer of crystalline silicon, in a first implementation of the invention.

FIG. 2 shows a method of fabricating a multilayer film 2' including an ultrathin layer of crystalline silicon 2 from a substrate S of crystalline structure, in a first implementation of the invention.

The substrate S has a surface that has previously been cleaned, i.e. a surface without oxide. The cleaning method is described below.

The substrate S may be a substrate of crystalline silicon or of crystalline germanium, for example.

The substrate S may be a <100> FZ, CZ, etc. substrate. It may be polished on both faces, for example. It may have any resistivity. In the examples below, it presents resistivity lying in the range 1 ohm-centimeter (Ωcm) to 5 Ωcm.

The method of the invention may be applied to one or both opposite faces of the silicon substrate.

In the examples below, the substrate S is a substrate of crystalline silicon.

The method of fabricating a multilayer film 2' comprises a step a) of exposing the cleaned surface of the substrate S to a radiofrequency plasma generated in a gaseous mixture comprising $SiF_4$, hydrogen, and argon, so as to form on the surface of the substrate S an ultrathin layer of crystalline silicon 2 including microcavities. These microcavities contain hydrogen.

The power of the radiofrequency plasma lies in the range 10 watts (W) at a power density of 100 mW/cm² to 60 W at a power density of 600 mW/cm². The pressure of the gaseous mixture lies in the range 200 Pa to 400 Pa.

The temperature of the substrate lies in the range 150° C. to 300° C., the flow rate of $SiF_4$ lies in the range 1 cm³/min to 10 cm³/min, the flow rate of hydrogen lies in the range 1 cm³/min to 60 cm³/min, and the flow rate of argon lies in the range 1 cm³/min to 80 cm³/min.

The duration of the step a) preferably lies in the range 1 min to 5 h. It may also be less than that or greater than that. For example, when step a) is performed over 10 min, an ultrathin layer of crystalline silicon 2 is obtained that presents a thickness of 0.15 µm.

The thickness of the ultrathin layer of crystalline silicon 2 depends on the duration of step a) and on the flow rate of $SiF_4$.

For example, for a deposition speed of about 0.3 nanometers per second (nm/s), a duration of 10 min for step a) may correspond to an ultrathin layer of crystalline silicon 2 having a thickness of 0.18 µm. A duration of 5 h for step a) may correspond to an ultrathin layer of crystalline silicon having a thickness of 5.4 µm.

In preferred manner, during step a), the power of the radiofrequency plasma is 50 W at a power density of 500 mW/cm$^2$, the pressure of the gaseous mixture is 293 Pa, the duration of the exposure to the radiofrequency plasma is 30 min (in order to deposit an ultrathin layer of crystalline silicon 2 having a thickness of 0.5 µm), and the temperature of the substrate S is 200° C.

In still more preferred manner, the gaseous flow rate of $SiF_4$ is set at 3 cm$^3$/min, the gaseous flow rate of hydrogen lies in the range 1 cm$^3$/min to 60 cm$^3$/min, and the gaseous flow rate of argon is 80 cm$^3$/min.

In still more preferred manner, the gaseous flow rate of $SiF_4$ is set at 3 cm$^3$/min, the gaseous flow rate of hydrogen is set at 5 cm$^3$/min, and the gaseous flow rate of argon is 80 cm$^3$/min. This obtains an $H_2/SiF_4$ ratio of 1.66.

After this step a) of exposing a surface of the substrate S to a radiofrequency plasma of $H_2/SiF_4/Ar$ for a duration of 30 min under the above optimum conditions, an ultrathin layer of crystalline silicon 2 is obtained that is made up of three sublayers comprising an interface sublayer 19, an epitaxial core sublayer 20, and a surface sublayer 21.

The ultrathin layer of crystalline silicon 2 is shown in detail in FIG. 5.

The interface sublayer 19 includes a large fraction of microcavities and a small fraction of crystalline silicon. This interface sublayer 19 is in direct contact with the surface of the substrate. It is positioned between the substrate S and the epitaxial core sublayer 20. It presents thickness lying in the range 0 to 9 nm, which thickness depends on the hydrogen fraction used.

The epitaxial core sublayer 20 is made up of a monocrystalline silicon fraction, a fraction having large grains of crystalline silicon, and a fraction having small grains of crystalline silicon. The epitaxial core sublayer 20 presents thickness lying in the range 90 nm to 170 nm (for 10 min of plasma).

The surface sublayer 21 is made up of a fraction having large grains of crystalline silicon, a fraction having small grains of crystalline silicon, and a fraction of $SiO_2$. It presents thickness lying in the range 0 to 5 nm.

The thicknesses of all of these sublayers depend on the hydrogen fraction used for diluting the $SiF_4$.

FIG. 4a shows the deposition speed of the fine epitaxial core sublayer 20 of the ultrathin silicon layer 2 and also the composition thereof as a function of the hydrogen flow rate (for flow rates in the range 1 cubic centimeter per second (cm$^3$/s) to 60 cm$^3$/s).

The flow rate of $SiF_4$ is 3 cm$^3$/s and the flow rate of Ar is 80 cm$^3$/s in the examples of FIGS. 4a to 4c.

Hydrogen flow rate is plotted in cm$^3$/s along the abscissa axis 5. In FIG. 4a, the left-hand ordinate axis 7 represents the deposition speed of the epitaxial core sublayer 20, and the right-hand ordinate axis 6 represents the composition thereof (in percentage).

Curve 8 representing the deposition speed of the epitaxial core sublayer 20 as a function of the hydrogen flow rate shows that at low $H_2$ dilution, the deposition speed is low, lying in the range 0.1 nm/s to 0.3 nm/s.

However, as the $H_2$ dilution increases, the deposition speed also increases, with a maximum close to 0.3 nm/s (when the $SiF_4$ flow rate is equal to the $H_2$ flow rate, i.e. 3 cm$^3$/s).

Any subsequent increase in the $H_2$ dilution has the consequence of a lower deposition rate.

Curve 9 represents the fraction of monocrystalline silicon (c-Si) as a function of the hydrogen flow rate.

Curve 10 represents the fraction of small grains of silicon as a function of the hydrogen flow rate.

Curve 11 represents the fraction of large grains of silicon as a function of the hydrogen flow rate.

The curves 9 to 11 show that the epitaxial core sublayer 20 has a fraction of crystalline silicon that is large (about 80% to 95%), a fraction of small grains of silicon lying in the range about 5% to 20%, and a fraction of large grains lying in the range about 1% to 5%. The greatest crystalline silicon fraction (approximately 95%) is obtained for a crystalline silicon film 2 deposited with identical flow rates of $SiF_4$ and $H_2$ (3 cm$^3$/min) and an argon flow rate of 80 cm$^3$/min.

FIG. 4b shows the thickness of the interface sublayer 19 and its composition as a function of the hydrogen flow rate (rates in the range 1 cm$^3$/min to 60 cm$^3$/min).

Curve 12 represents the thickness of the interface sublayer 19 as a function of the hydrogen flow rate.

Curve 13 represents the microcavity fraction as a function of the hydrogen flow rate.

Curve 14 represents the crystalline silicon fraction as a function of the hydrogen flow rate.

At a low $H_2$ flow rate (1 cm$^3$/min), there is no interface sublayer 19 at all. As the $H_2$ flow rate increases, the interface sublayer 19 appears and it reaches a thickness maximum at 10 cm$^3$/min. An increase in the $H_2$ flow rate gives rise to a decrease in the thickness of the interface sublayer 19. The reason for such behavior is that at a low $H_2$ flow rate the deposition speed is low and thus hydrogen can be desorbed from the thin film of silicon 2 that develops.

When the $H_2$ flow rate is greater, the deposition speed increases, and the hydrogen is trapped in the interface with the crystalline silicon substrate. At an even higher $H_2$ flow rate, the deposition speed decreases once more. A certain quantity of hydrogen is trapped in the interface sublayer 19 and another portion is desorbed, having the result of decreasing the thickness of the interface layer.

Curves 13 and 14 show that the interface sublayer 19 is made up mainly of microcavities (about 80%) and a little crystalline silicon (about 20%). Its composition is almost independent of the $H_2$ dilution.

FIG. 4c shows the roughness of the surface sublayer 21 and its composition as a function of the hydrogen flow rate (flow rate in the range 1 cm$^3$/min to 60 cm$^3$/min).

Curve 15 represents the roughness of the surface sublayer 21 as a function of the hydrogen flow rate.

Curve 16 represents the fraction of large grains of silicon as a function of the hydrogen flow rate.

Curve 17 represents the fraction of small grains of silicon as a function of the hydrogen flow rate.

Curve 18 represents the $SiO_2$ fraction as a function of the hydrogen flow rate.

Curve 15 shows that the roughness of the ultrathin layers of silicon 2 increases with the $H_2$ flow rate from about 0.9 nm for a flow rate of 1 cm$^3$/min up to about 4.5 nm for a flow rate of 60 cm$^3$/min.

From the curves 17 to 18, the SiO$_2$ fraction is almost independent of the hydrogen flow rate.

The interface sublayer 19 presents quantities of oxygen, hydrogen, and fluorine that are greater than those of the epitaxial core sublayer 20. This is due to the fact that the interface sublayer 19 presents many defects (about 80% microcavities).

The method of fabricating a multilayer film 2' also comprises a step b) of depositing at least one layer of material on the ultrathin layer of crystalline silicon 2 in order to cooperate with the ultrathin layer of crystalline silicon 2 to form a multilayer film 2'. The multilayer film 2' has at least one mechanically strong layer 3 so as to form a multilayer film 2' that is mechanically strong and mechanically stable.

The mechanically strong layer 3 is the last layer that is deposited on the multilayer film 2'.

The mechanically strong layer 3 is preferably a layer of metal. It may be made of some other material such as glass or a polymer. The term "mechanically strong multilayer film 2'" is used to designate a multilayer film 2' presenting sufficient strength to enable the multilayer film to be separated during a subsequent step as described below without damaging the ultrathin layer of crystalline silicon 2.

The mechanically strong layer 3 is preferably made of chromium. It is deposited on one of the layers of the multilayer film 2' by a vacuum evaporation method. The thickness of the chromium layer 3 is greater than 100 nm. Chromium at a thickness of 150 nm ensures that the multilayer film 2' has sufficient mechanical strength to enable it subsequently to be separated from the substrate S.

In the embodiment of FIG. 2, during the step b), only one chromium layer is deposited on the ultrathin layer of crystalline silicon 2.

In another possible implementation, during deposition step b), one or more epitaxial layers of semiconductor materials are deposited on the ultrathin layer of crystalline silicon 2 in order to form a multilayer film 2' having one or more layers of semiconductor materials between the ultrathin layer of crystalline silicon 2 and the mechanically strong layer 3.

The layers of semiconductor materials may be based on silicon, germanium, or SiGe, for example. They may be intrinsic, P-doped, or N-doped. The multilayer film 2' may form a PIN or NIP, P-N, or N-P junction. It is possible to form junctions directly on the substrate S.

In a possible implementation, step b) includes an operation of depositing a passivation layer before depositing the mechanically strong layer 3. This passivation layer may be a layer of silicon nitride serving to obtain a low density of surface defects.

The method of fabricating a multilayer film 2' also includes a step c) of annealing the substrate S covered in the multilayer film at a temperature that is higher than 400° C. and that preferably lies in the range 400° C. to 900° C., thereby enabling the multilayer film 2' to be separated from or peeled off the substrate S, and consequently enabling the ultrathin layer of crystalline silicon 2 to be separated therefrom.

During step c), as the temperature is rising, the hydrogen atoms recombine in the microcavities of the ultrathin layer of crystalline silicon 2 so as to form microbubbles of H$_2$, thereby increasing the volume of the microcavities in the ultrathin layer of crystalline silicon 2.

In the implementation of FIG. 2, during the step c), the substrate S covered in the multilayer film is heated up to 800° C. in an oven.

The temperature of the oven is then lowered to ambient temperature.

The oven may optionally be opened at about 250° C. in order to improve the separation of the multilayer film 2' from the surface of the substrate S.

Figure 3:
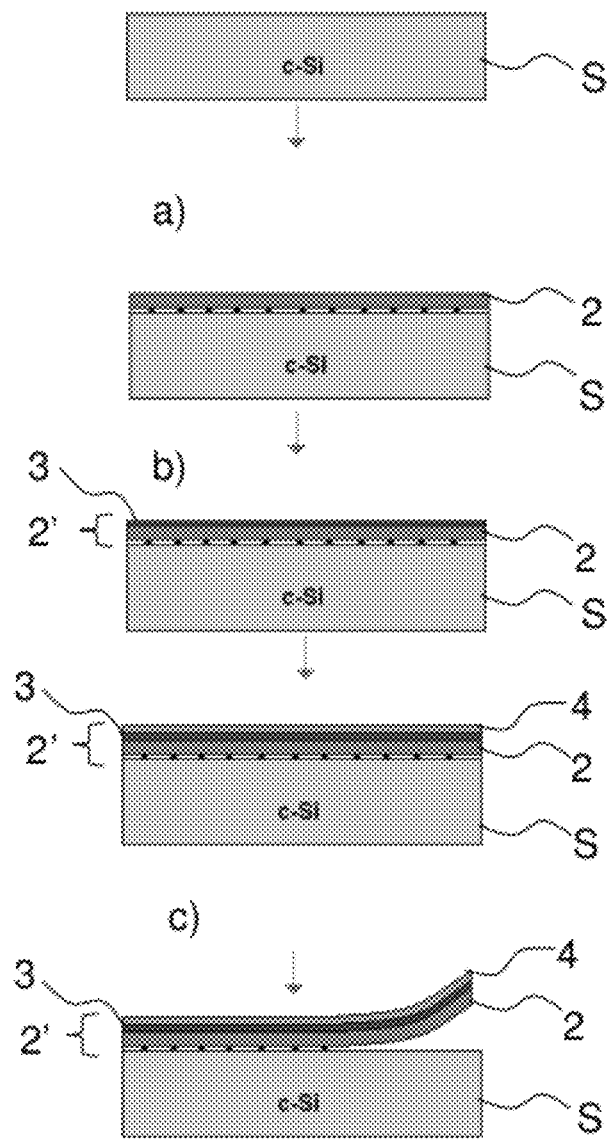
FIG. 3 shows a method of fabricating a multilayer film having an ultrathin layer of crystalline silicon, in a second implementation of the invention.

In another implementation, as shown in FIG. 3, during step b), the chromium layer 3 is subsequently covered in a polyamide layer 4. The substrate S covered in the multilayer film 2' is then heated in an oven to a temperature in the range 250° C. to 350° C.

Thereafter, during step c), the substrate S covered in the multilayer film 2' is heated up to a temperature in the range 300° C. to 500° C. in the oven.

The temperature of the oven is then lowered down to ambient temperature.

The oven may optionally be opened at about 250° C. in order to improve separation of the multilayer film 2' from the surface of the substrate S.

In alternative manner, annealing step c) may be performed in a rapid thermal annealing (RTA) oven that has heater lamps enabling a very fast temperature rise to be achieved. It is possible to reach 900° C. in a few minutes.

The method of fabricating a multilayer film 2' may include, prior to step a), a step a') of cleaning the surface of the substrate that is initially covered in silicon oxide (SiO$_2$), as described in document FR 09/55766.

In a possible implementation, this step a') comprises an operation of exposing the surface to a radiofrequency plasma generated from a fluorine-containing gas, thereby etching the layer of silicon oxide, and an operation of exposing the surface to a radiofrequency plasma of hydrogen.

The fluorine-containing gas (or a gas based on fluorine) is preferably SiF$_4$ gas. Other fluorine-containing gases may be used, such as SF$_6$, for example.

In another possible implementation, cleaning step a') may be performed using a wet method with a standard solution of hydrofluoric acid diluted with deionized water.

The advantage of using the RF plasma method is that steps a') and a) can then be performed in the same reaction chamber of a PECVD reactor, operating at a frequency of 13.56 megahertz (MHz).

The method of the invention may thus be implemented in a single PECVD chamber. The steps a') and a) are performed in the same PECVD chamber, thus making it possible to avoid breaking the vacuum, to avoid contaminating the substrate with external pollutants, to increase the speed of the fabrication method, and to reduce fabrication costs.

This cleaning step a') using a dry method is performed for a duration lying in the range 60 seconds (s) to 900 s. The power of the plasma lies in the range 1 W to 30 W, corresponding to a power density lying in the range 10 mW/cm$^2$ to 300 mW/cm$^2$. The pressure of the fluorine-containing gas lies in the range 1.33 Pa to 26.66 Pa.

This step a') causes fluorine-containing elements to be fixed or adsorbed on the surface of the silicon substrate, thereby giving rise to surface defects, in particular broken Si bonds.

These fluorine-containing elements are subsequently eliminated by the operation of exposing the surface of the silicon substrate that includes fluorine-containing elements to a radiofrequency hydrogen plasma.

This operation of exposing the surface of the silicon substrate that includes fluorine-containing elements to a radiofrequency hydrogen plasma is performed for a duration lying in the range 5 s to 120 s, with a plasma at a power lying in the range 1 W to 30 W (power density lying in the range 10 mW/cm$^2$ to 30 mW/cm$^2$). The hydrogen pressure lies in the range 1.33 Pa to 133.32 Pa. This operation of exposure to a radiofrequency hydrogen plasma is optional.

The invention provides a method of fabricating ultrathin films of crystalline silicon that is simpler, less burdensome, and that makes it possible to obtain crystalline silicon films having a thickness lying in the range 0.1 µm to 5 µm with a high degree of crystallinity.

The invention claimed is:

1. A method of fabricating a multilayer film (2') comprising at least one ultrathin layer (2) of crystalline silicon, the film being fabricated from a substrate (S) having a crystalline structure and including a previously-cleaned surface, the method being characterized in that it comprises the following steps:
   a) exposing said cleaned surface to a radiofrequency plasma generated in a gaseous mixture of $SiF_4$, hydrogen, and argon, the power density of the radiofrequency plasma lying in the range 100 mW/cm$^2$ to 600 mW/cm$^2$, the pressure of the gaseous mixture in the range 200 Pa to 400 Pa, the temperature of the substrate (S) lying in the range 150° C. to 300° C., the flow rate of $SiF_4$ lying in the range 1 cm$^3$/min to 10 cm$^3$/min, the flow rate of hydrogen lying in the range 1 cm$^3$/min to 60 cm$^3$/min, the flow rate of argon lying in the range 1 cm$^3$/min to 80 cm$^3$/min, so as to form on said cleaned surface an ultrathin layer of crystalline silicon (2) comprising a plurality of sublayers (19, 20, 21) including an interface sublayer (19) in contact with the substrate (S) and containing microcavities;
   b) depositing at least one layer of material on said ultrathin layer of crystalline silicon (2) so as to co-operate with said ultrathin layer of crystalline silicon (2) to form a multilayer film (2'), said multilayer film including at least one mechanically strong layer (3) so as to form a multilayer film (2') having sufficient strength to enable said multilayer film (2') to be separated without damaging the ultrathin layer of crystalline silicon (2); and
   c) annealing the substrate (S) covered in said multilayer film (2') at a temperature higher than 400° C., thereby enabling said multilayer film (2') to be separated from the substrate (S).

2. A method of fabricating a multilayer film (2') according to claim 1, the method being characterized in that during step a), the power density of the radiofrequency plasma is 500 mW/cm$^2$, the pressure of the gaseous mixture is 293 Pa, and the temperature of the substrate (S) covered in said multilayer film (2') is 200° C.

3. A method of fabricating a multilayer film (2') according to claim 1, characterized in that during step a), the gaseous flow rate of $SiF_4$ is 3 cm$^3$/min, the gaseous flow rate of hydrogen is 5 cm$^3$/min, and the gaseous flow rate of argon is 80 cm$^3$/min.

4. A method of fabricating a multilayer film (2') according to claim 1, characterized in that the mechanically strong layer (3) is a layer of chromium deposited on one of the layers of the mechanically strong multilayer film (2') by a vacuum evaporation method.

5. A method of fabricating a multilayer film (2') according to claim 4, characterized in that during step c) the substrate (S) covered in said mechanically strong multilayer film (2') is heated up to 800° C.

6. A method of fabricating a multilayer film (2') according to claim 1, characterized in that the surface of the substrate is initially covered in a layer of silicon oxide and the fabrication method includes, prior to step a), a step a') of cleaning the surface of the substrate that is initially covered in silicon oxide.

7. A method of fabricating a multilayer film (2') according to claim 6, characterized in that said step a') comprises an operation of exposing said surface to a radiofrequency plasma generated from a fluorine-containing gas, thereby etching the layer of silicon oxide, and an operation of exposing said surface to a radiofrequency plasma of hydrogen.

8. A method of fabricating a multilayer film (2') according to claim 7, characterized in that the steps a') and a) are performed in the same reaction chamber of a PECVD reactor.

9. A method of fabricating a multilayer film (2') according to claim 1, characterized in that step b) includes an operation of depositing a passivation layer prior to depositing the mechanically strong layer (3).

10. A method of fabricating a multilayer film (2') according to claim 1, characterized in that during step b), a first layer of P- or N-doped material is deposited on said ultrathin crystalline silicon layer (2), said first layer of P- or N-doped material being covered in a second layer of N- or P-doped material in order to obtain a P-N or an N-P junction.

11. A method of fabricating a multilayer film (2') according to claim 2, characterized in that during step a), the gaseous flow rate of $SiF_4$ is 3 cm$^3$/min, the gaseous flow rate of hydrogen is 5 cm$^3$/min, and the gaseous flow rate of argon is 80 cm$^3$/min.

12. A method of fabricating a multilayer film (2') according to claim 2, characterized in that the mechanically strong layer (3) is a layer of chromium deposited on one of the layers of the mechanically strong multilayer film (2') by a vacuum evaporation method.

13. A method of fabricating a multilayer film (2') according to claim 3, characterized in that the mechanically strong layer (3) is a layer of chromium deposited on one of the layers of the mechanically strong multilayer film (2') by a vacuum evaporation method.

* * * * *